US007278126B2

(12) United States Patent
Sun et al.

(10) Patent No.: US 7,278,126 B2
(45) Date of Patent: Oct. 2, 2007

(54) METHOD AND APPARATUS FOR FIXING HOLD TIME VIOLATIONS IN A CIRCUIT DESIGN

(75) Inventors: Yigang Sun, San Diego, CA (US); Jie Gong, San Diego, CA (US); Chih-Tung (Tony) Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 78 days.

(21) Appl. No.: 11/030,352

(22) Filed: Jan. 5, 2005

(65) Prior Publication Data

US 2005/0268263 A1    Dec. 1, 2005

Related U.S. Application Data

(60) Provisional application No. 60/575,263, filed on May 28, 2004.

(51) Int. Cl.
*G06F 17/50* (2006.01)
(52) U.S. Cl. ............................................. 716/6; 716/11
(58) Field of Classification Search ...................... None
See application file for complete search history.

(56) References Cited

U.S. PATENT DOCUMENTS

| | | | |
|---|---|---|---|
| 5,764,528 A | | 6/1998 | Nakamura ................... 364/489 |
| 5,896,299 A * | | 4/1999 | Ginetti et al. ................... 716/4 |
| 6,591,407 B1 | | 7/2003 | Kaufman ..................... 716/10 |
| 6,651,224 B1 * | | 11/2003 | Sano et al. ..................... 716/2 |
| 6,701,505 B1 | | 3/2004 | Srinivasan .................... 716/10 |
| 6,886,147 B2 * | | 4/2005 | Johnson et al. ................. 716/6 |
| 6,990,645 B2 * | | 1/2006 | Lichtensteiger et al. ........ 716/6 |
| 6,990,646 B2 * | | 1/2006 | Yoshikawa ..................... 716/6 |
| 2001/0007144 A1 * | | 7/2001 | Terazawa ....................... 716/6 |
| 2003/0101399 A1 | | 5/2003 | Yoshikawa .................. 714/744 |
| 2004/0139410 A1 * | | 7/2004 | Ghameshlu et al. ........... 716/6 |

OTHER PUBLICATIONS

Kuetzer, Kurt, et al.; "Is Redundancy Necessary to Reduce Delay?"; IEEE Apr. 1991; New York, NY; pp. 427-435.
Shenoy, Narendra, et al; "Minimum Padding to Satisfy Short Path Constraints"; IEEE 1993; Berkeley, CA; pp. 156-161.
Singh, Kanwar Jit, et al; "Timing Optimization of Combinational Logic"; IEEE 1998; Berekeley, CA; pp. 282-285.

(Continued)

*Primary Examiner*—Leigh M. Garbowski
(74) *Attorney, Agent, or Firm*—Howard H. Seo; Thomas R. Rouse

(57) ABSTRACT

To fix hold time violations, timing analysis is initially performed on a circuit design for each set of timing constraints to determine a setup slack and a hold slack for each signal path for that set of timing constraints. The slack for a signal path indicates the amount of timing margin or the amount of timing violation for that signal path. Signal paths with hold time violations (or "hold paths") are identified and retained, and other signal paths without hold time violations are discarded. For each hold path, signal paths with at least one node in common with the hold path (or "related setup paths") are identified and retained. Related setup paths with large setup slacks may be pruned. The hold time violations for the hold paths are then fixed based on the hold slacks for the hold paths and the setup slacks for the related setup paths.

38 Claims, 10 Drawing Sheets

OTHER PUBLICATIONS

Kim, Ki-Wook, et al; "Coupling-Aware Minimum Delay Optimisation for Domino Logic Circuits"; Electronics Letters; Jun. 21, 2001; vol. 37, No. 13, no page numbers.

Becer, Murat, et al; "Crosstalk Noise Control in an SoC Physical Design Flow"; IEEE Apr. 2004; Austin, TX; pp. 488-497.

* cited by examiner

METHOD AND APPARATUS FOR FIXING HOLD TIME VIOLATIONS IN A CIRCUIT DESIGN

The present Application for Patent claims priority to Provisional Application No. 60/575,263 entitled "Hold Time Fixing for Multimode Design" filed May 28, 2004, and assigned to the assignee hereof and hereby expressly incorporated by reference herein.

BACKGROUND

I. Field

The present invention relates generally to electronics circuits, and more specifically to techniques for fixing timing violations in a circuit design.

II. Background

A digital circuit design often includes a large number of sequential and combinatorial cells. A sequential cell is a circuit element that is triggered by a clock signal, e.g., a register or a latch. A combinatorial cell is a circuit element that is not triggered by a clock signal, e.g., an AND gate, an OR gate, some other type of gate, an inverter, and so on. A sequential cell typically has various timing requirements such as setup time and hold time requirements. The setup time is the amount of time a signal is required to remain stable at a data input of the sequential cell before the arrival of a clock edge. The hold time is the amount of time the signal is required to remain stable at the sequential cell input after the arrival of the clock edge.

The combinatorial cells are typically dispersed among the synchronous cells in the circuit design. The combinatorial cells introduce delays on the signals sent between the sequential cells. If the delays through the combinatorial cells are too long, then the signals may violate setup time requirements for the sequential cells. Conversely, if the delays through the combinatorial cells are too short, then the signals may violate hold time requirements. Setup and hold time violations may also be caused by clock skew, or more generally clock edge alignment. Fixing hold time violations may sometimes cause setup time violations, especially in a high-speed circuit design where setup and hold time violations are difficult to fix because a high clock rate results in less time between stages of sequential cells.

Many conventional circuit design tools are not able to effectively deal with hold time violations. For example, these tools may only add a delay buffer at either a starting point or an end point of a signal path with hold time violation. This limitation makes it difficult to fix many hold time violations without violating setup time requirements. A delay buffer inserted at a starting point or an end point to fix hold time violation for a signal path may cause setup time violation in the same signal path or another signal path.

There is therefore a need in the art for techniques to more efficiently fix hold time violations in a circuit design.

SUMMARY

Techniques for fixing hold time violations in a circuit design are described herein. These techniques can fix hold time violations for one or more operating modes without causing setup time violations. Each operating mode may impose a different set of timing constraints on the circuit design.

To fix hold time violations, timing analysis is initially performed on the circuit design for each set of timing constraints to determine a setup slack and a hold slack for each pertinent signal path for that set of timing constraints, as described below. The terms "signal path" and "timing path" are synonymous and are used interchangeably herein. The pertinent signal paths are signal paths with hold time violations plus signal paths used or considered to fix hold time violations. A slack for a signal path is the difference between (1) the time a signal actually arrives at an end point of the signal path and (2) the time the signal is required to arrive at the end point. The slack for a signal path indicates the amount of timing margin or the amount of timing violation for that signal path.

Signal paths with hold time violations (which are called "hold paths") are identified and retained, and other signal paths without hold time violations are discarded or pruned. For each hold path, signal paths with at least one node in common with the hold path (which are called "related setup paths") are identified and retained. Related setup paths with large setup slacks may be pruned. The hold time violations for the hold paths are then fixed based on the hold slacks for the hold paths and the setup slacks for the related setup paths. One or more delay buffers may be inserted in one or more nodes of each hold path to fix the hold time violation. The node(s) for each hold path and the amount of delay to be inserted at each node may both be selected based on the setup slacks for the related setup paths so that setup time requirements are not violated by the delay inserted at the node.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The hold time fixing techniques described herein may be used to fix hold time violations for a circuit design that has one or multiple operating modes. The operating modes may include functional modes and/or test modes. Each operating mode may be associated with a specific set of timing constraints for the circuit design. Different sets of timing constraints may arise due to, e.g., the circuit design being operated at different clock rates for the different operating modes. The different sets of timing constraints for multiple operating modes may impose different timing requirements on the same signal paths. The hold time fixing techniques can fix hold time violations for all operating modes while ensuring that setup time requirements are not violated for all operating modes.

Figure 1:
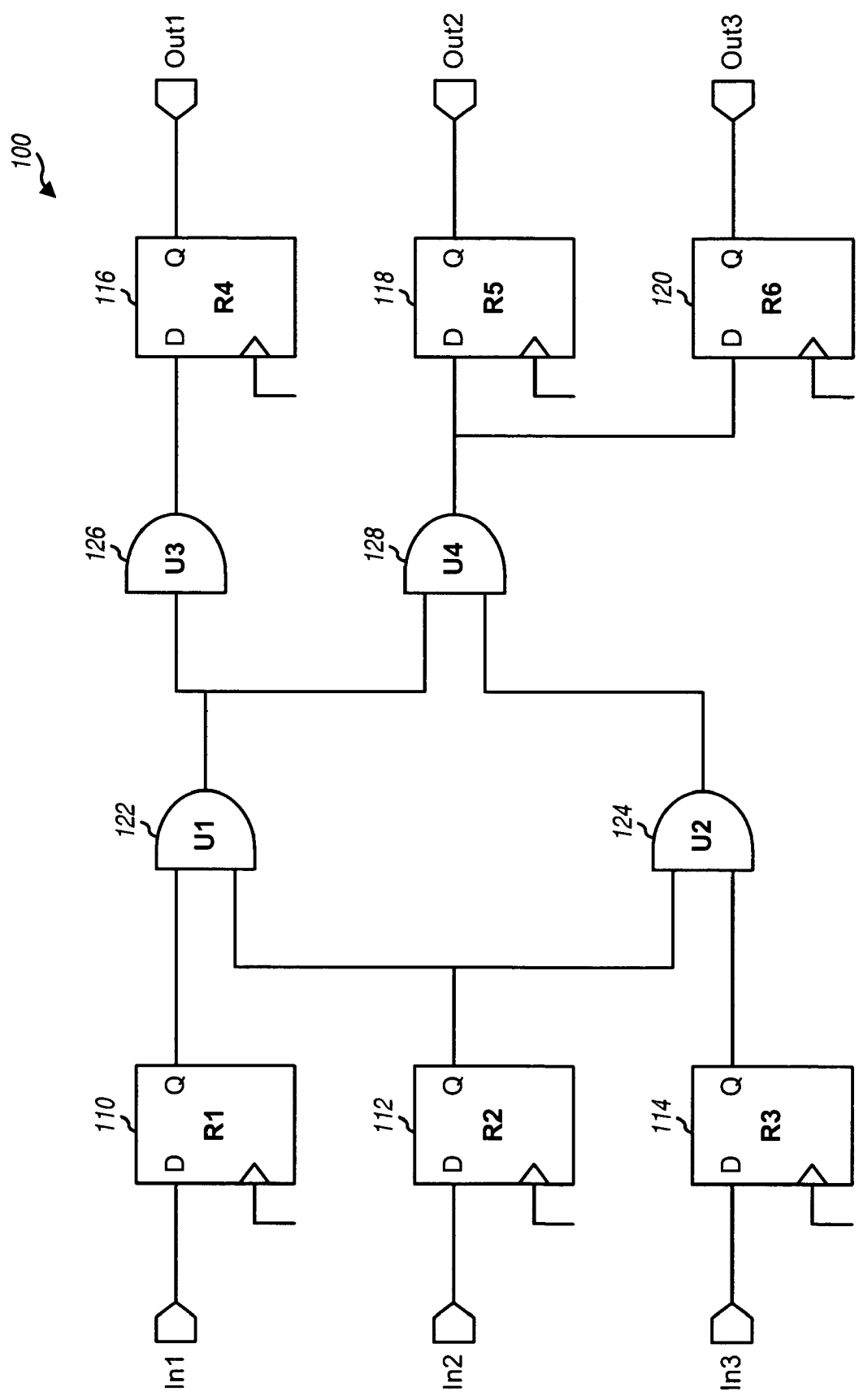
FIG. 1 shows a schematic diagram of a simple circuit design.

FIG. 1 shows a schematic diagram of a simple circuit design 100 used to describe the hold time fixing techniques. Circuit design 100 includes six registers 110 through 120 (which are labeled as R1 through R6, respectively) and four AND gates 122 through 128 (which are labeled as U1 through U4, respectively). Each register is a D flip-flop having a data (D) input, a clock input, and a data (Q) output. The D inputs of registers 110, 112 and 114 couple to input ports In1, In2 and In3, respectively, of circuit design 100. The Q outputs of registers 110 and 112 couple to the two inputs of AND gate 122. The Q outputs of registers 112 and 114 couple to the two inputs of AND gate 124. The output of AND gate 122 couples to the single input of AND gate 126. The outputs of AND gates 122 and 124 couple to the two inputs of AND gate 128. The output of AND gate 126 couples to the D input of register 116. The output of AND gate 128 couples to the D inputs of registers 118 and 120. The Q outputs of registers 116, 118 and 120 couple to output ports Out1, Out2 and Out3, respectively, of circuit design 100.

FIG. 1 shows a simple circuit design. Most circuit designs include many more registers, gates, and possibly other circuit elements. The hold time fixing techniques may be used for various circuit designs of different levels of complexity.

A circuit design may be represented with a circuit model for fixing hold time violations. The circuit model contains sufficient information to fix hold time violations and not necessarily all of the information from the circuit design. Information that is not needed to fix hold time violations may be discarded to reduce the complexity of the circuit model and also to reduce hardware requirements for fixing hold time violations (e.g., memory requirement and CPU time). The clock distribution network that generates clock signals for sequential cells in the circuit design is not modeled because changing delay in the clock distribution network can change the timing for parts of the circuit design that are not modeled, which may cause undetected timing violations.

In an embodiment, the circuit model represents the circuit design as a network of nodes and connections. In general, each node may represent an input or an output of a circuit cell, a module, a circuit block, and so on, depending on the level of abstraction desired for the circuit design. A circuit cell may be a sequential cell or a combinatorial cell. A module may be a group of cells with certain functionality and designed for easy replication. A circuit block may be a larger collection of circuit cells. For clarity, each node in the circuit model described below represents an input or an output of a circuit cell or the circuit design.

Figure 2:
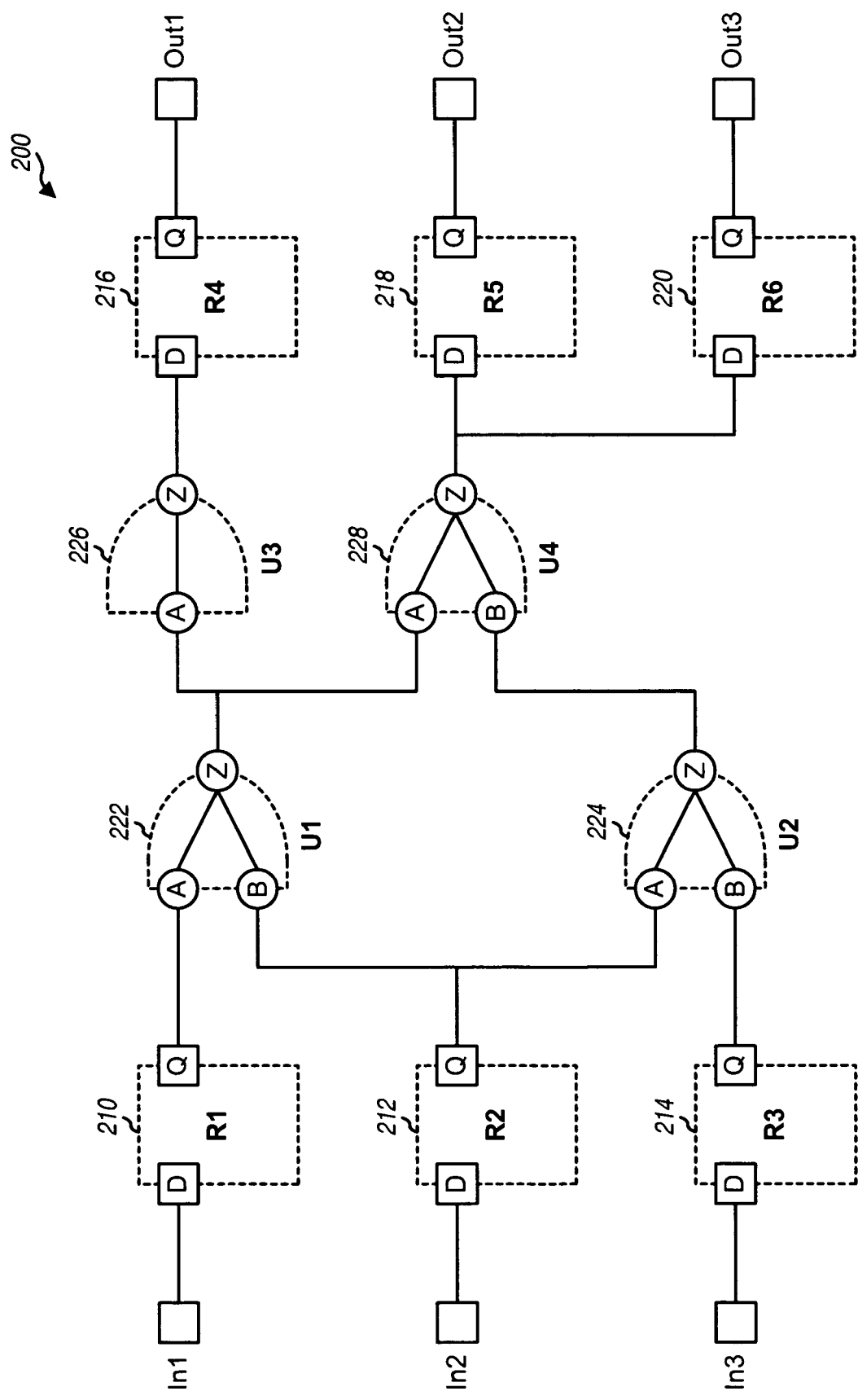
FIG. 2 shows a circuit model for the circuit design in FIG. 1.

FIG. 2 shows a diagram of a circuit model 200 for circuit design 100 in FIG. 1. For circuit model 200, registers 110 through 120 are modeled by sequential cells 210 through 220, respectively. Each sequential cell has a D input port and a Q output port. The clock inputs of the registers are not modeled for simplicity. AND gates 122 through 128 are modeled by combinatorial cells 222 through 228, respectively. Each combinatorial cell has the same number of input and output pins as the AND gate being modeled. The combinatorial cells are modeled with input and output pins to allow for insertion of delay buffers at the input or output of these cells. Different timing results may be achieved by inserting delay buffers at different locations, as described below. The input and output ports of circuit model 200 and the input and output pins of the sequential cells are represented by square boxes. The input and output pins of the combinatorial cells are represented by circles. The connections between the various circuit cells and the timing arcs inside of the combinatorial cells are represented by solid lines.

The circuit model contains nodes and connections. The nodes correspond to the square boxes and circles. The connections between the nodes and the timing arcs within the combinatorial cells are represented by the solid lines. The squares in the circuit model represent the starting points and end points of timing paths. A timing path is a signal path between two points having setup and/or hold time requirements. Each timing path is defined by two square boxes, where one square box is for the starting point of the timing path and the other square box is for the end point. The two square boxes for each timing path are connected via zero or more internal nodes or circles. Each timing path may be modeled with a path object that includes all of the nodes (i.e., the square boxes and circles) for that timing path.

The timing paths in the circuit model may be analyzed for all of the operating modes supported by the circuit design. The timing analysis for each operating mode provides a setup slack and a hold slack for each timing path in the circuit model. The setup slack and hold slack for each timing path are computed in different manners.

Each sequential cell has a certain propagation delay from the clock input to the data output, which is referred to as the clock-to-output delay. Each combinatorial cell has a certain propagation delay from the input to the output. Each signal trace between two nodes also has a certain propagation delay due to parasitic loading and so on. The circuit design is typically generated with circuit cells taken from a design library. This design library may provide a best-case (shortest) delay and a worst-case (longest) delay for each sequential cell and each combinatorial cell in the library. The design library may further specify certain setup and hold time requirements on each sequential cell. Different design libraries may have different best-case and worst-case delays for a given circuit cell and different setup and hold time requirements for a given sequential cell.

To meet setup time requirement, a signal should arrive at the end point of a timing path prior to some designated time. Longer delays through the circuit cells in the timing path are typically detrimental to meeting the setup time requirement. The setup time analysis for each timing path is typically performed using the worst-case (longest) delays for all of the circuit cells in the timing path. Conversely, to meet hold time requirement, a signal should arrive at the end point no earlier than some designated time (i.e., should remain stable at the end point of the timing path for some amount of time after a clock edge). Shorter delays through the circuit cells in the timing path are typically detrimental to meeting the hold time requirement. The hold time analysis for each timing path is typically performed using the best-case (shortest) delays for all of the circuit cells in the timing path.

For each operating mode, timing analysis may be performed for each timing path in the circuit design to obtain the setup slack and the hold slack for that timing path in that operating mode. The setup slack is the difference between the actual signal arrival time and the required signal arrival time for the timing path with the worst-case (longest) delays for the circuit cells. The hold slack is the difference between the actual signal arrival time and the required signal arrival time for the timing path with the best-case (shortest) delays for the circuit cells. A positive setup/hold slack value indicates conformance to setup/hold time requirement. A negative setup/hold slack value indicates violation of the setup/hold time requirement.

The timing analysis provides a set of timing results (or timing information) for each operating mode. Each set of timing results contains the setup slacks and the hold slacks for all timing paths in the circuit design for one operating mode. Multiple sets of timing results may be obtained for multiple operating modes. Some timing paths may have hold time violations.

The hold time fixing techniques attempt to fix timing paths with hold time violations while ensuring that setup time requirements for timing paths affected by the hold time fixes are not violated. A timing path with hold time violation may be fixed by inserting delay at one or more locations within the timing path. However, a delay inserted at a given node affects the setup time of all timing paths containing that node. The techniques select appropriate locations for inserting delays in timing paths with hold time violations such that the setup time requirements for related timing paths are not violated. For clarity, the techniques are described below for several simple examples.

Figure 3:
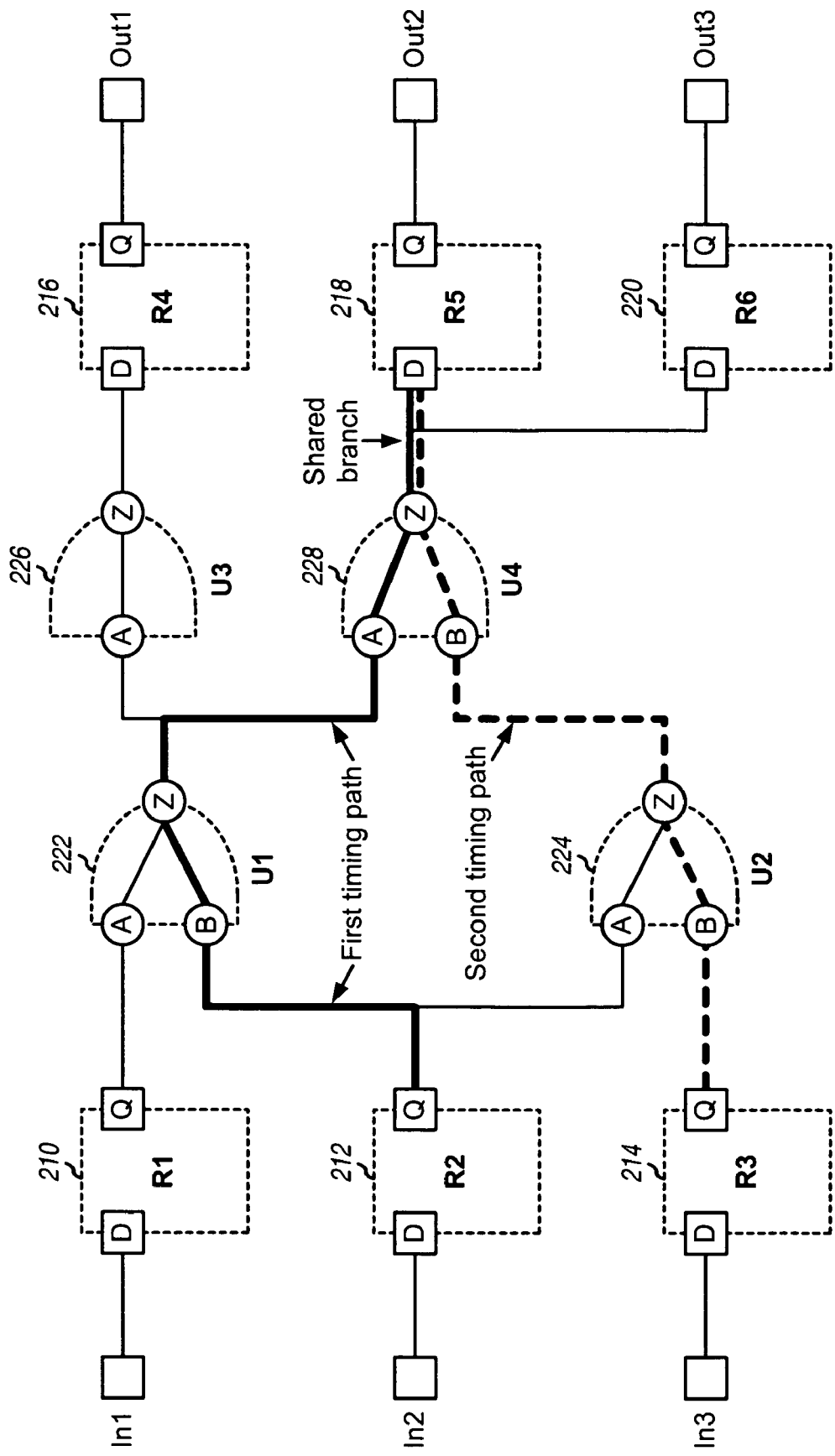
FIG. 3 shows two timing paths in the circuit model in FIG. 2.

FIG. 3 shows an example for fixing hold time violation with two timing paths in circuit model 200 in FIG. 2. The first timing path is from the Q output of register R2 to the D input of register R5 and is shown by a heavy solid line. The first timing path traverses through AND gates U1 and U4. The second timing path is from the Q output of register R3 to the D input of register R5 and is shown by a heavy dashed line. The second timing path traverses through AND gates U2 and U4. The first and second timing paths share the branch from the Z output of AND gate U4 to the D input of register R5. The timing path from the Q output of register R2 via AND gates U2 and U4 to the D input of register R5 is different from the first timing path, even though both have the same starting and end points.

Table 1 gives timing information for the first and second timing paths. All of the timing values in Table 1 are given in units of nanoseconds (nsec). Table 1 assumes that the registers are clocked with a clock period of 3.0 nsec.

TABLE 1

| First timing path from register R2 to R5 | | | Second timing path from register R3 to R5 | | |
|---|---|---|---|---|---|
| Node | Incr | Path | Node | Incr | Path |
| R2 - clock input | 0.0 | 0.0 | R3 - clock input | 0.0 | 0.0 |
| R2 - Q output | 0.3 | 0.3 | R3 - Q output | 1.0 | 1.0 |
| U1 - B input | 0.05 | 0.35 | U2 - B input | 0.1 | 1.1 |
| U1 - Z output | 0.1 | 0.45 | U2 - Z output | 0.5 | 1.6 |
| U4 - A input | 0.05 | 0.5 | U4 - B input | 0.1 | 1.7 |
| U4 - Z output | 0.15 | 0.65 | U4 - Z output | 0.5 | 2.2 |
| R5 - D input | 0.05 | 0.7 | R5 - D input | 0.1 | 2.3 |
| Actual arrival time | | 0.7 | Actual arrival time | | 2.3 |
| Clock network delay | 0.3 | | Clock network delay | 0.1 | |
| R5 - clock input | 0.0 | 0.3 | R5 - clock input | 3.0 | 3.1 |
| Library hold time | 0.55 | 0.85 | Library setup time | −0.45 | 2.65 |
| Required arrival time at R5 - D input (no earlier than) | | 0.85 | Required arrival time at R5 - D input (no later than) | | 2.65 |
| Slack (VIOLATED) | | −0.15 | Slack (MET) | | 0.35 |

For each timing path in the "Node" column lists all of the nodes in that timing path, which are taken from circuit model 200 in FIG. 2. These nodes include the square boxes for the starting point and the end point of the timing path as well as the circles for the internal nodes of the timing path. The "Incr" column shows the propagation delay for each branch between two nodes in the timing path. For example, for the first timing path, the propagation delay from the clock input to the Q output of register R2 is 0.3 nsec, the propagation delay from the Q output of register R2 to the B input of AND gate U1 is 0.05 nsec, the propagation delay from the B input to the Z output of AND gate U1 is 0.1 nsec, and so on. The "Path" column shows the accumulated delay through the timing path. For example, for the first timing path, the signal is delayed by 0.3 nsec at the Q output of register U2, by 0.35 nsec at the B input of AND gate U1, by 0.45 nsec at the Z output of AND gate U1, and so on. The accumulated delay for a given node is equal to the accumulated delay for a preceding node plus the propagation delay for the branch between the two nodes.

Table 1 also shows other pertinent timing information for each timing path. The clock network delay denotes the delay observed by the clock signal for a register, i.e., the delay from a clock entry point to the register clock input. The library setup time and library hold time indicate the setup and hold times, respectively, required by the design library for the register. The required arrival time indicates the time the signal needs to arrive at the D input of the register in order to meet the setup/hold time for the register. The signal is required to arrive at the end point prior to the required arrival time in order to meet the setup time requirement. Conversely, the signal is required to arrive at the end point no earlier than the required arrival time in order to meet the hold time requirement. The slack for each timing path is equal to the difference between the actual arrival time and the required arrival time. A positive slack value indicates that the setup or hold time requirement is met for that timing path, and a negative slack value indicates that the setup or hold time requirement is violated.

For the first timing path, the signal experiences a total delay of 0.7 nsec from the clock input of register R2 to the D input of register R5. The signal thus arrives at the D input of register R5 0.7 nsec after the clock edge for register R2. The clock edge for register R5 occurs 0.3 nsec after the clock edge for register R2. If the required hold time for register R5 is 0.55 nsec, then the signal needs to arrive at the D input of register R5 no earlier than 0.55 nsec after the clock edge for register R5, which is 0.85 nsec after the clock edge for register R2. However, since the total delay for the signal is only 0.7 nsec from the clock edge for register R2, the signal arrives 0.15 nsec prior to the required arrival time. This −0.15 nsec is a negative hold slack, which means that the signal needs to be delayed at least 0.15 nsec in order to meet the hold time requirement. The first timing path thus has a hold time violation.

For the second timing path, the signal experiences a total delay of 2.3 nsec from the clock input of register R3 to the D input of register R5. The next clock edge for register R5 occurs 3.1 nsec after the clock edge for register R3. The signal thus arrives at the D input of register R5 0.8 nsec prior to the next clock edge for register R5. If the required setup time for register R5 is 0.45 nsec, then the signal arrives at the D input 0.35 nsec prior to the required arrival time. This 0.35 nsec is a positive setup slack, which means that the signal may be delayed by up to 0.35 nsec and still meet the setup time requirement.

The hold time violation for the first timing path may be fixed by making this timing path longer, time-wise. This is equivalent to delaying the signal in the first timing path so that the signal arrives after the signal of the previous stage gets completely latched. The additional delay may be obtained by inserting one or more delay buffers at one or more appropriate locations within the first timing path. A delay buffer may be inserted after an input port for the circuit model, before an output port for the circuit model, before an input of a circuit cell, or after an output of the circuit cell.

A delay buffer provides a delay that falls within a range of possible delays. This delay range accounts for uncertainty due to different operating conditions, e.g., different temperature, power supply voltages, and so on. The delay range is also dependent on the design library from which the delay buffer is obtained, the IC process used to fabricate the delay buffer, and so on. The ratio of the longest delay to the shortest delay for the delay range is referred to as a delay ratio. For example, if a delay buffer provides a delay of 0.3 nsec for the worst-case operating condition and 0.1 nsec for the best-case operating condition, then the delay ratio is 3, or 0.3/0.1=3. The delay ratio may vary for different input slew rates, different output loads, and so on for the delay buffer. The use of a strong delay buffer can reduce the variation in the delay ratio due to input slew and output load. For a timing path with hold time violation, the circuit cells are typically located close to one another. This is because a big output load in the timing path would increase cell delay, which would then help hold time so that the timing path is less likely to violate hold time requirement. The variation in the delay ratio is thus typically small for hold time critical paths. In any case, the delay ratio is considered when fixing hold time violation to ensure that setup time violations are not caused by the hold time fix.

The hold time violation for the first timing path in FIG. 3 may be fixed by inserting one or more delay buffers having the total amount of delay required to meet the hold time requirement for register R5. This total delay is assumed to be the smallest (best-case) delay for the inserted delay buffer(s). The longest (worst-case) delay for each inserted delay buffer may be computed by multiplying the best-case delay by the delay ratio for the delay buffer. The second timing path is then re-evaluated with the inserted delay buffer(s) having the worst-case delay to ensure that the setup time requirement is still met.

For the example shown in FIG. 3, a delay of 0.2 nsec may be inserted within the first timing path to remedy the 0.15 nsec of hold time violation and to provide 0.05 nsec of safety margin. If the delay ratio is 3, then x nsec of best-case delay corresponds to 3x nsec of worst-case delay. Since the first and second timing paths share the branch from the Z output of AND gate U4 to the D input of register R5, no more than 0.1 nsec may be inserted in this branch to achieve a setup slack of at least 0.05 nsec for the second timing path, assuming a delay ratio of 3.

The following solutions are available to fix the hold time violation for the first timing path with a delay ratio of 3:
1. Insert a (best-case) delay of 0.2 nsec or more at any point before the Z output of AND gate U4; or
2. Insert a (best-case) delay of 0.1 nsec or less at the Z output of AND gate U4 and insert the remaining (best-case) delay at any point in the second timing path before the Z output of AND gate U4.

For the first solution, inserting the delay before the Z output of AND gate U4 does not affect the second timing path. For the second solution, inserting a best-case delay of 0.1 nsec at the Z output of AND gate U4 corresponds to inserting a worst-case delay of 0.3 nsec for the second timing path. This would then reduce the setup slack for the second timing path from 0.35 nsec to 0.05 nsec. Inserting the remaining amount of delay before the Z output of AND gate U4 does not affect the second timing path. The two solutions satisfy both setup and hold times for the first and second timing paths.

The example shown in FIG. 3 assumes that the first timing path does not have any other related setup paths with worse setup slack. If there are additional related setup paths, then delay buffers may be inserted in a manner to ensure that the setup and hold time requirements for all of the timing paths are met.

Figure 4:
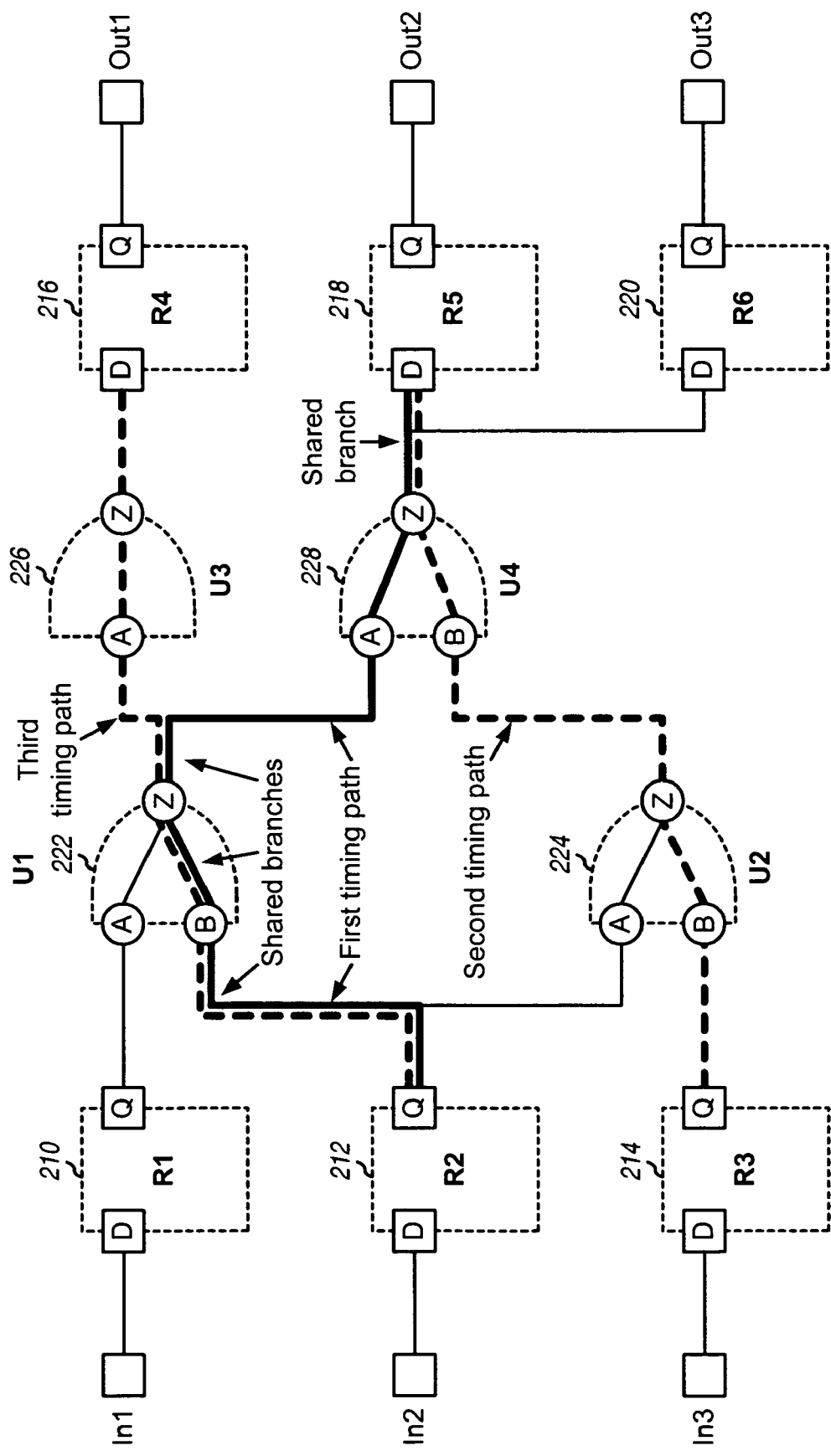
FIG. 4 shows three timing paths in the circuit model in FIG. 2.

FIG. 4 shows an example for fixing hold time violation with three timing paths in circuit model 200 in FIG. 2. The first and second timing paths in this example are as described above in FIG. 3. The third timing path is from the Q output of register R2 to the D input of register R4 and is shown by a heavy dashed line. The third timing path traverses through AND gates U1 and U3. Table 1 above gives the timing information for the first and second timing paths. Table 2 below gives the timing information for the third timing path.

TABLE 2

Third timing path from register R1 to R4

| Node | Incr | Path |
|---|---|---|
| R2 - clock input | 0.0 | 0.0 |
| R2 - Q output | 1.3 | 1.3 |
| U1 - B input | 0.15 | 1.45 |
| U1 - Z output | 0.4 | 1.85 |
| U3 - A input | 0.15 | 2.0 |
| U3 - Z output | 0.35 | 2.35 |
| R4 - D input | 0.1 | 2.45 |
| Actual arrival time | | 2.45 |
| Clock network delay | 0.2 | |
| R4 - clock input | 3.0 | 3.2 |
| Library setup time | −0.35 | 2.85 |
| Required arrival time at R4 - D input (no later than) | | 2.85 |
| Slack (MET) | | 0.40 |

For the third timing path, the signal experiences a total delay of 2.45 nsec from the clock input of register R2 to the D input of register R4. The next clock edge for register R4 occurs 3.2 nsec after the clock edge for register R2. The signal thus arrives at the D input of register R4 0.75 nsec prior to the next clock edge for register R4. If the required setup time for register R4 is 0.35 nsec, then the signal arrives at the D input 0.4 nsec prior to the required arrival time. This 0.4 nsec is a positive setup slack, which means that the signal may be delayed by up to 0.4 nsec and still meet the setup time requirement.

For the example shown in FIG. 4, a delay of 0.2 nsec may be inserted within the first timing path to remedy the 0.15 nsec of hold time violation and to provide 0.05 nsec of safety margin. Since the first and second timing paths share the branch from the Z output of AND gate U4 to the D input of register R5, no more than 0.1 nsec may be inserted in this branch to achieve a setup slack of at least 0.05 nsec for the second timing path, assuming a delay ratio of 3. Since the first and third timing paths share the branches from the Q output of register R2 to the Z output of AND gate U1, no more than 0.1 nsec may be inserted in these branches to achieve a setup slack of at least 0.1 nsec for the third timing path, again assuming a delay ratio of 3.

The following solutions are available to fix the hold time violation for the first timing path with a delay ratio of 3:
1. Insert a (best-case) delay of 0.2 nsec at the A input of AND gate U4; or
2. Insert a (best-case) delay of 0.1 nsec at the Z output of AND gate U4 and insert a (best-case) delay of 0.1 nsec at one of the following nodes: the Z output of AND gate U1, the B input of AND gate U1, or the Q output of register R2.

For the first solution, inserting a best-case delay of 0.2 nsec at the A input of AND gate U4 does not affect the second or third timing path. For the second solution, inserting a best-case delay of 0.1 nsec at the Z output of AND gate U4 corresponds to inserting a worst-case delay of 0.3 nsec for the second timing path. This would then reduce the setup slack for the second timing path from 0.35 nsec to 0.05 nsec. Inserting a best-case delay of 0.1 nsec at the Z output of AND gate U1, the B input of AND gate U1, or the Q output of register R2 corresponds to inserting a worst-case delay of 0.3 nsec for the third timing path. This would then reduce the setup slack for the third timing path from 0.4 nsec to 0.1 nsec. The two solutions satisfy both the hold time requirement for the first timing path and the setup time requirements for the second and third timing paths.

As shown by the examples in FIGS. 3 and 4, the additional delay to fix hold time violation may be inserted at a single node or distributed among multiple nodes. In many cases, hold time violation may be fixed by inserting a delay buffer at a single location in the timing path. Various criteria may be used to determine the location for the delay buffer. In an embodiment, the delay buffer is inserted at a location with the largest setup slack. This embodiment may provide more safety margin for the timing paths. In another embodiment, the delay buffer is inserted at a location that is common for as many timing paths with hold time violations as possible. This embodiment may reduce the number of delay buffers inserted. The delay buffer may also be inserted based on other criteria (e.g., loading considerations), or a combination of different criteria.

The circuit design may exclude certain nodes from delay insertion and may mark these protected nodes with "don't touch" attribute. Delays may be inserted in a manner to avoid disturbing these protected nodes.

It some cases, it may not be possible to fix hold time violation for a timing path without violating setup time for another timing path. For example, if the propagation delay through AND gate U3 in FIG. 4 is 0.7 nsec instead of 0.4 nsec, then the setup slack for the third timing path would be reduced from 0.4 nsec to 0.1 nsec. Furthermore, the branch between the Z output of AND gate U1 and the A input of AND gate U4 may be protected so that no delay buffer may be inserted at these two nodes. In this case, for the example shown in FIG. 4, inserting a sufficient amount of delay in one or more nodes to fix the hold time violation for the first timing path would cause a setup time violation for the second and/or third timing paths. In general, it might not be possible to insert delay in a timing path with hold time violation if its related setup paths have zero or small setup slack.

Redundant path insertion (RPI) may be used to fix hold time violation for a timing path when it is not possible to insert delay in the existing nodes of the timing path. RPI creates a redundant path for all or a portion of the timing path with hold time violation. A sufficient amount of delay may then be inserted in the redundant path to fix hold time violation without affecting the setup time of other related setup paths.

Figure 5:
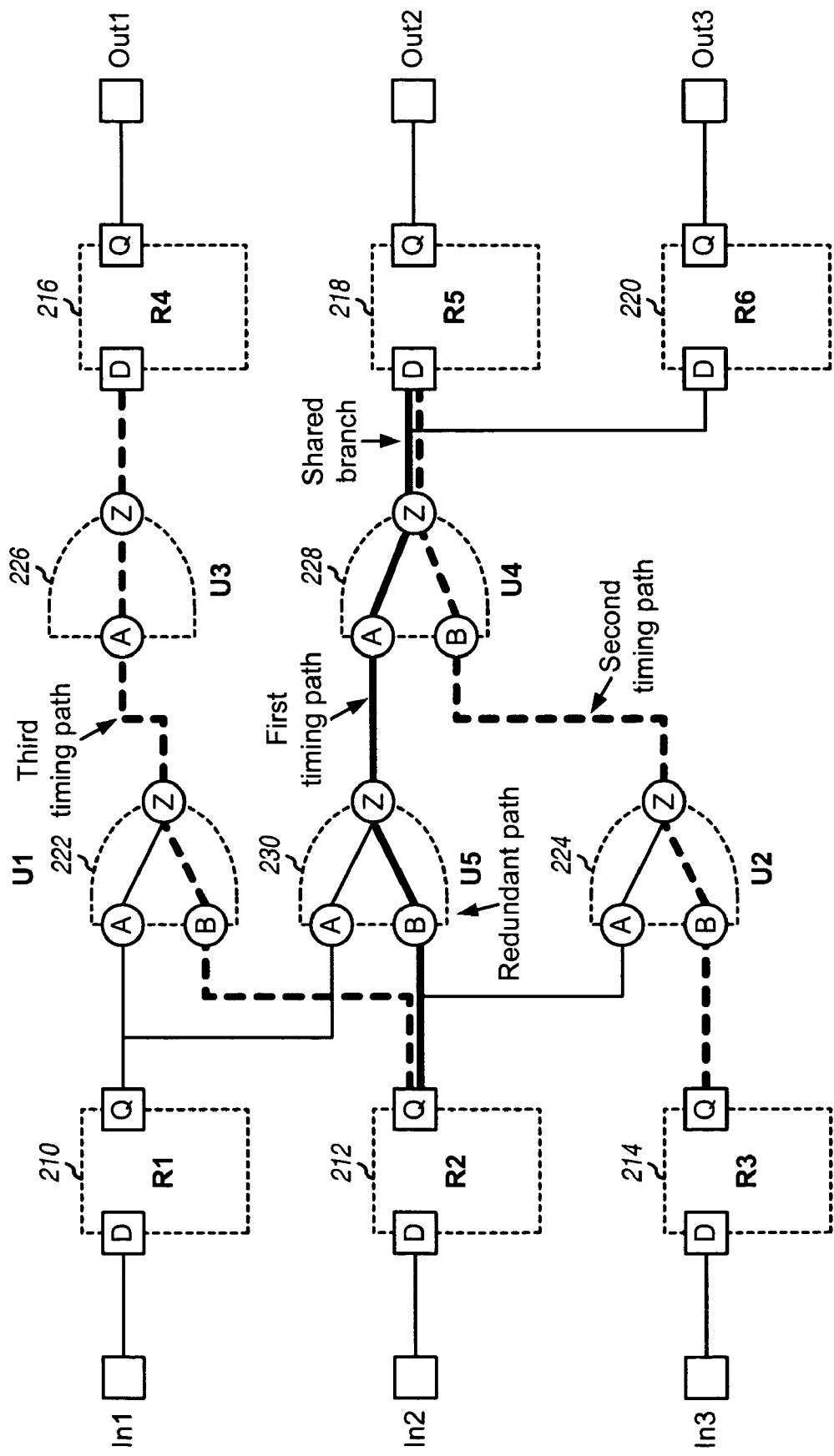
FIG. 5 shows an example of redundant path insertion.

FIG. 5 shows an example for fixing hold time violation using redundant path insertion. FIG. 5 shows all of the registers and AND gates shown in FIG. 4. In addition, FIG. 5 shows an AND gate (U5) 230 that has been added to create a redundant path for a portion of the first timing path. AND gate U5 has its A and B inputs coupled to the Q outputs of registers R1 and R2, respectively, similar to AND gate U1. The Z output of AND gate U5 couples to the A input of AND gate U4. The Z output of AND gate U1 only couples to the A input of AND gate U3. AND gate U5 forms the redundant path and the Z output of AND gate U5 is logically equivalent to the Z output of AND gate U1. The connection between the Z output of AND gate U1 and the A input of AND gate U4 can thus be removed.

A delay may be inserted at the B input or the Z output of AND gate U5 to fix the hold time violation for the first timing path without affecting the setup time of the second and third timing paths. For this example, a sufficient amount of delay can be added at the input and/or output of AND gate U5, without having to insert a delay at the protected node for the A input of AND gate U4.

FIGS. 3 through 5 show three simple examples that illustrate the hold time fixing techniques. A circuit design typically contains many timing paths and nodes. A process/procedure may be devised to systematically identify and fix timing paths with hold time violations.

Figure 6:
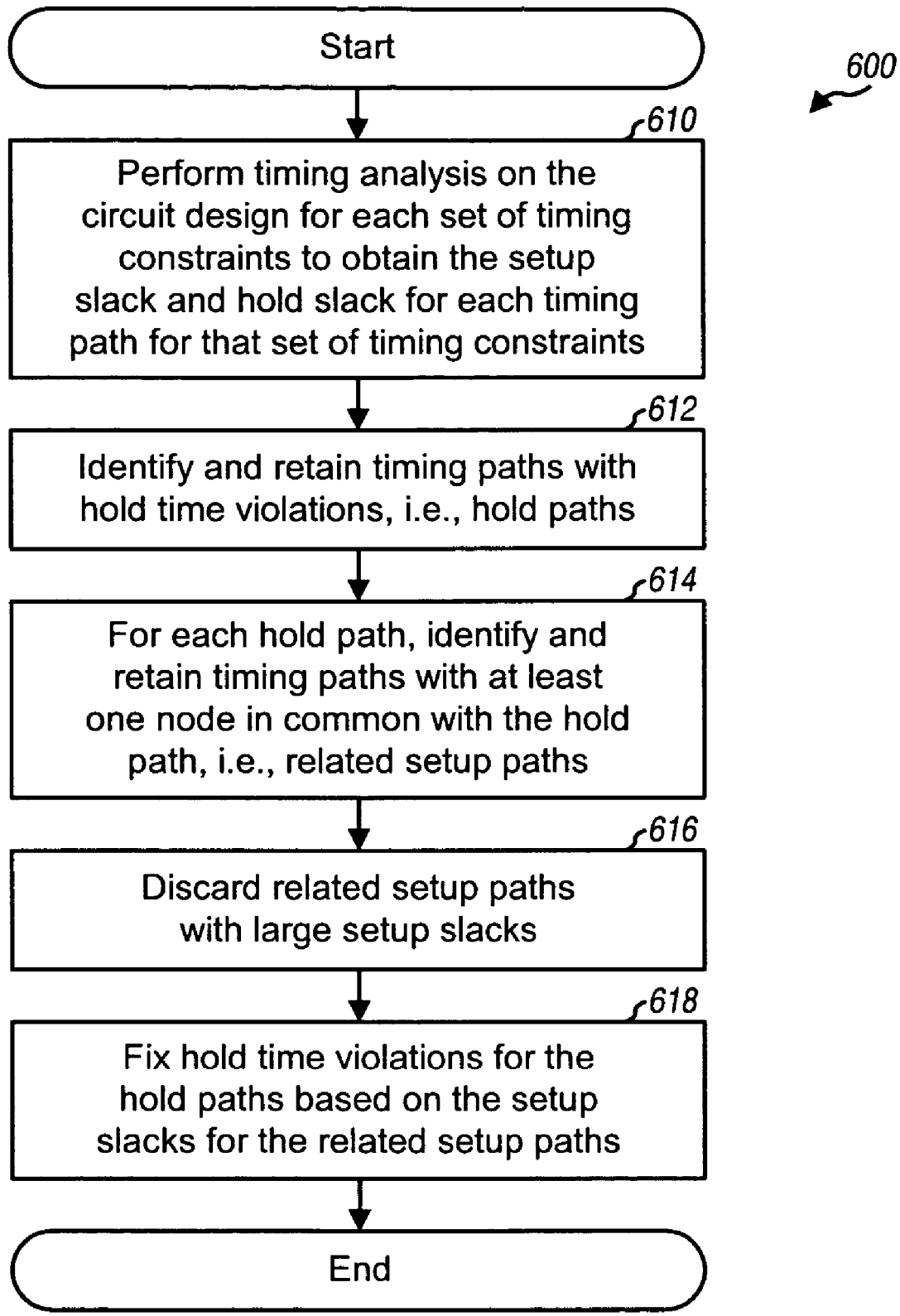
FIG. 6 shows a process for fixing hold time violations in a circuit design.

FIG. 6 shows a process 600 for fixing hold time violations for a circuit design. Timing analysis is performed on the circuit design for each set of timing constraints to obtain the setup slack and the hold slack for each timing path for that set of timing constraints (block 610). Different timing constraints (e.g., for different operating modes) and also different design libraries typically impose different setup and hold time requirements on the circuit design. The timing analysis is performed with the timing requirements imposed by the design library and a given set of timing constraints. Only the setup slack and hold slack for each timing path are used to fix hold time violations. Timing information for individual nodes (e.g., signal arrival time at a node, which is an intermediate stage of a timing path) is not needed. For each timing path, different setup slacks and hold slacks may be obtained for different sets of timing constraints. Multiple instances of each timing path for different sets of timing constraints may be treated as separate timing paths for hold time fixing. Alternatively, the worst-case setup slack and the worst-case hold slack obtained for all sets of timing constraints may be kept for each timing path. In any case, the timing analysis in block 610 provides timing information for all timing paths for all sets of timing constraints. This timing information may be in the form of a first set of timing paths with hold slacks and a second set of timing paths with setup slacks, where the first and second sets each contain all of the timing paths in the circuit design. The timing information gives a big picture of the circuit design for all operating modes and may be used to fix hold time violations.

Timing paths with hold time violations (i.e., hold paths) are identified and retained, and other timing paths without hold time violations are discarded or pruned (block 612). The hold paths are timing paths in the first set with hold slacks less than a predetermined value (e.g., zero). For each hold path, timing paths in the second set with at least one node in common with the hold path (i.e., related setup paths) are identified and retained, and other timing paths in the second set are discarded (block 614). Related setup paths with large setup slacks are discarded (block 616). The setup slack for a related setup path may be considered to be large if it is larger than the delay ratio times the amount of hold time violation. For example, if a hold path has a hold time violation of 0.2 nsec and the delay ratio is 3, then all related setup paths with setup slacks greater than 0.6 nsec may be discarded. The hold time violations for the hold paths are then fixed based on the setup slacks for the related setup paths (block 618).

As shown in FIG. 6, only timing paths with hold time violations are retained in block 612, and only timing paths with setup time violations or small positive setup slacks are retained in blocks 614 and 616. All other timing paths not needed to fix hold time violations are pruned to reduce complexity and hardware requirements. The timing paths in the second set may also be selected by relevance in block 614 and not pruned by setup slack, in which case block 616 may be omitted.

To facilitate hold time fixing, the hold paths may be stored in a first database, and the related setup paths may be stored in a second database. The hold slacks for the hold paths and the setup slacks for the related setup paths may be updated at different times to fix the hold time violations in block 618. The use of separate databases can simplify the updating of the hold paths and the related setup paths.

Figure 7:
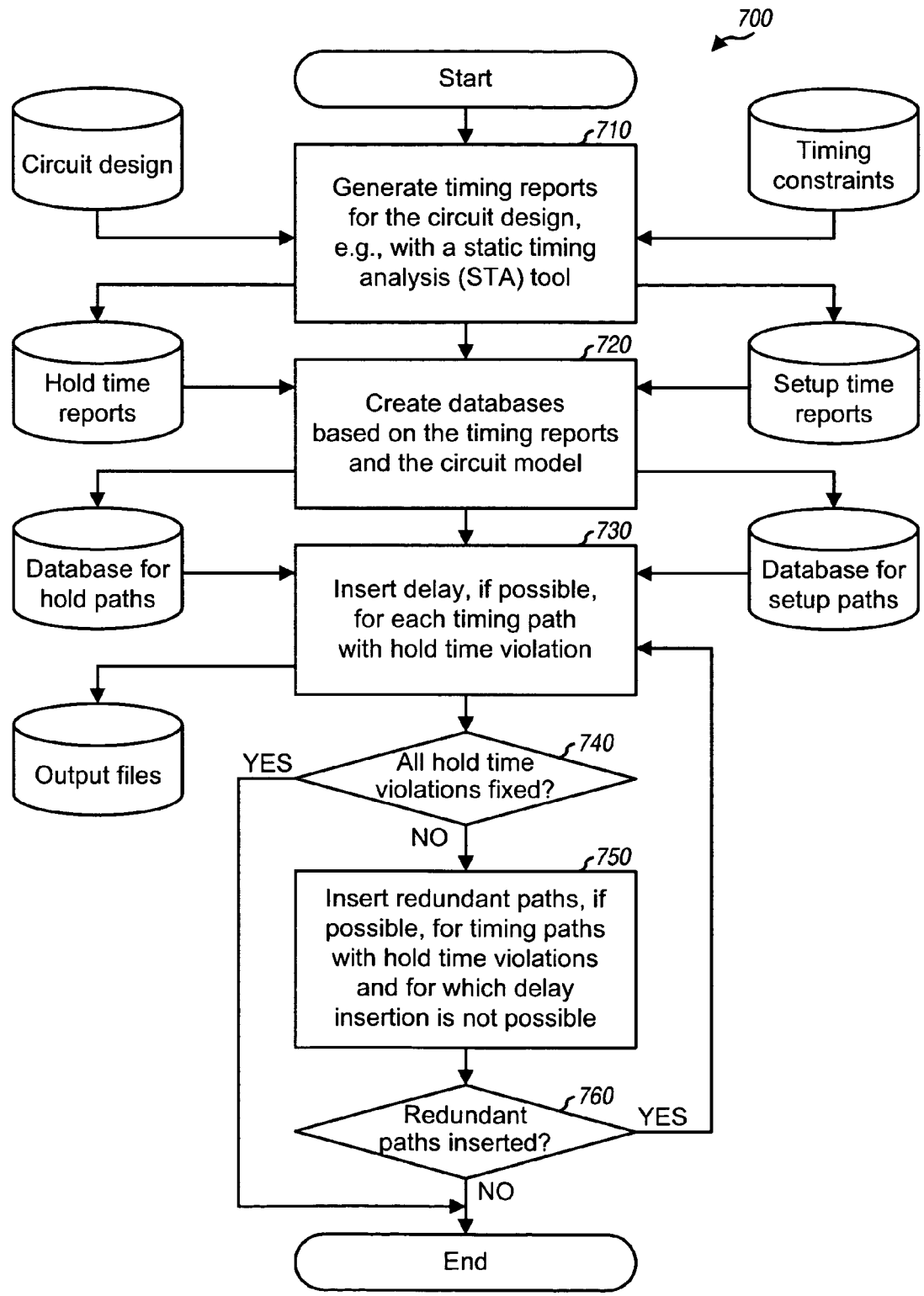
FIG. 7 shows a circuit design flow with hold time fixing.

FIG. 7 shows a circuit design flow 700 with hold time fixing. Initially, timing reports are generated for the circuit design for each set of timing constraints, e.g., using a static timing analysis (STA) tool (block 710). These timing reports may include hold time reports and setup time reports. One hold time report and one setup time report may be generated for each set of timing constraints. The hold time report for each set of timing constraints may contain a list of all hold paths for that set of timing constraints and the hold slack for each hold path. The setup time report for each set of timing constraints may contain all related setup paths for that set of timing constraints and the setup slack for each related setup path. In general, the STA tool may be programmed to provide (1) common or separate timing reports for setup and hold time information for the circuit design, (2) timing information for all timing paths or just certain timing paths, e.g., hold paths and related setup paths, and (3) only setup slack and hold slack for each timing path, or timing information for internal nodes as well. The pruning of timing paths may be performed by the STA tool or by subsequent processing. The STA tool may be PrimeTime® from Synopsys, Inc. or some other design tool from some other vendor.

Databases for the hold paths and related setup paths are created based on the timing reports and the circuit model (block 720). The circuit model includes nodes and connections, as described above. The database for the hold paths contains the hold slacks for these paths from the hold time reports for all sets of timing constraints. The database for the related setup paths contains the setup slacks for these paths from the setup time reports for all sets of timing constraints. Block 720 thus performs concatenation or combining of timing information for all sets of timing constraints. Block 720 may also discard related setup paths with large setup slacks. For each setup path that is discarded, if a node in that setup path exists in the hold path database but not in the setup path database, then the node in the hold path database is assigned the setup slack of the discarded setup path (e.g., 0.6 nsec for the example above for block 616), which is the biggest setup slack within consideration. This avoids over-borrowing slack from the discarded setup path.

A delay is inserted, if possible, for each timing path with hold time violation (block 730). The insertion of a delay changes the timing of one or more timing paths. Block 730 may be performed in an iterative manner whereby the database for the hold paths and the database for the related setup paths are updated after fixing each hold path, as described below. A determination is then made whether all timing paths with hold time violations are fixed (block 740). If the answer is 'No', then a redundant path is inserted, if possible, for each timing path with hold time violation and for which delay insertion is not possible (block 750). A determination is then made whether any redundant paths have been inserted (block 760). If the answer is 'Yes', then the process returns to block 730 to insert a delay for each timing path still having hold time violation. Otherwise, if all hold time violations have been fixed and the answer is 'Yes' for block 740, or if no redundant paths are inserted and the answer is 'No' for block 760, then the process terminates.

Process 700 may generate one or more output files, which may be called command files or scripts. The output file(s) may be used by one or more circuit design tools (e.g., place and route tools) to place and route the circuit cells and the inserted delay buffers for the circuit design.

Figure 8:
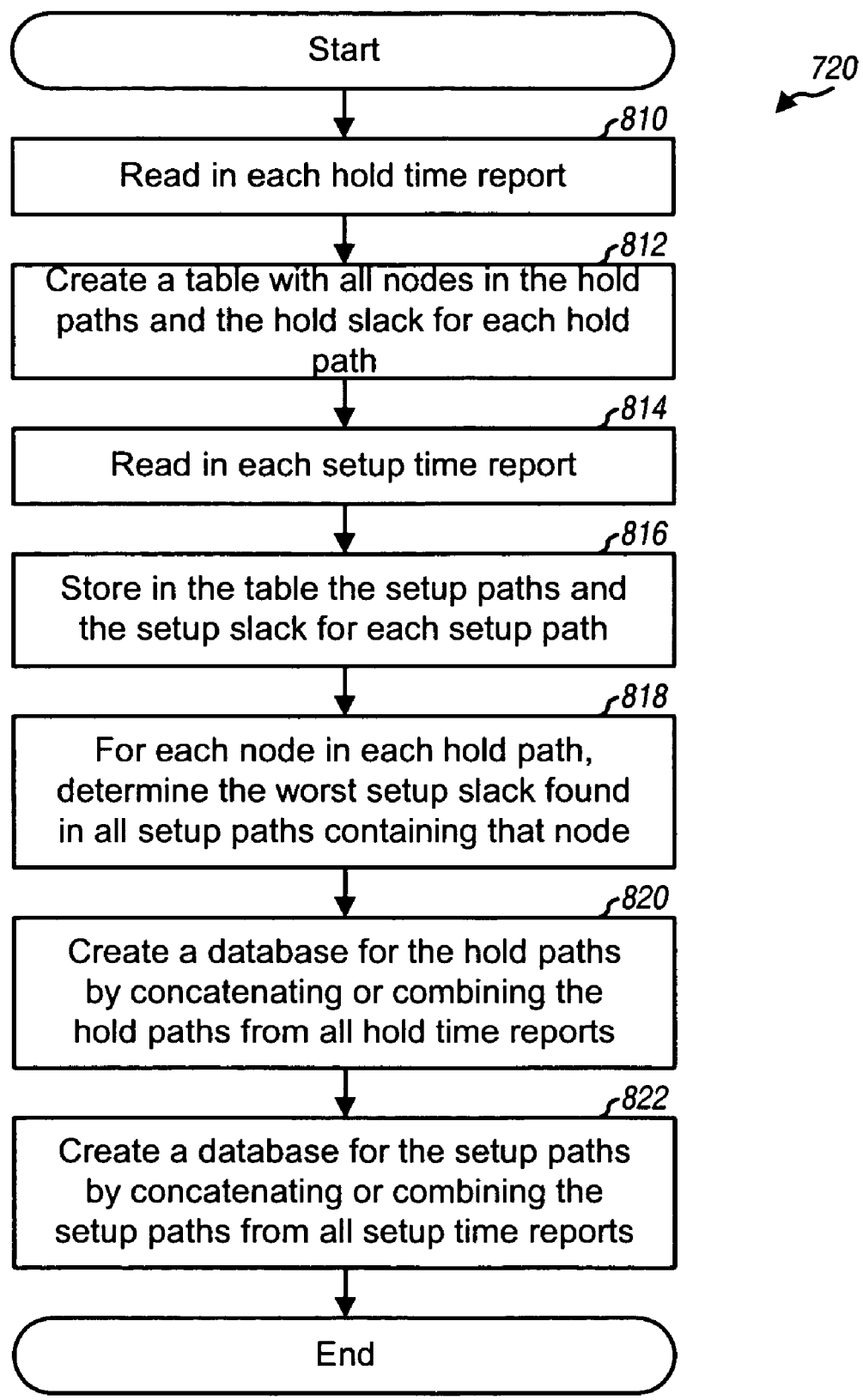
FIG. 8 shows a process for creating databases for hold paths and setup paths.

FIG. 8 shows an embodiment of block 720 for creating the databases for the hold paths and related setup paths. Each hold time report is initially read in (block 810). A table with all nodes in the hold paths is created, and the worst hold slack for each hold path from all hold time reports is stored in the table (block 812). The nodes in the table are initialized to a predetermined large value (e.g., one clock period). Each setup time report is then read in (block 814). The worst setup slack for each related setup path from all setup time reports is stored in the table (block 816).

For each node in each hold path, the best setup slack for all setup paths containing that node is determined (block 818). This may be achieved by updating the table with each related setup path read in from the setup time reports. For example, as each related setup path is read in, all of the nodes in that setup path are identified in the table, and each identified node is updated with the setup slack of that setup path if this setup slack is smaller than the current value stored for the node in the table. After all setup paths have been read in, the table stores the worst setup slack associated with each node for all hold paths.

The database for the hold paths is created by combining or concatenating the hold paths from all hold time reports (block 820). This database may contain (1) multiple instances of each hold path for multiple sets of timing constraints, with each hold path instance being associated with the hold slack for one set of timing constraints, or (2) one instance of each hold path for all sets of timing constraints, with the single hold path instance being associated with the worst hold slack for all sets of timing constraints. The database for the setup paths is created by combining or concatenating the related setup paths from all setup time reports (block 822). This database may likewise contain one or multiple instances of each related setup path.

Figure 9:
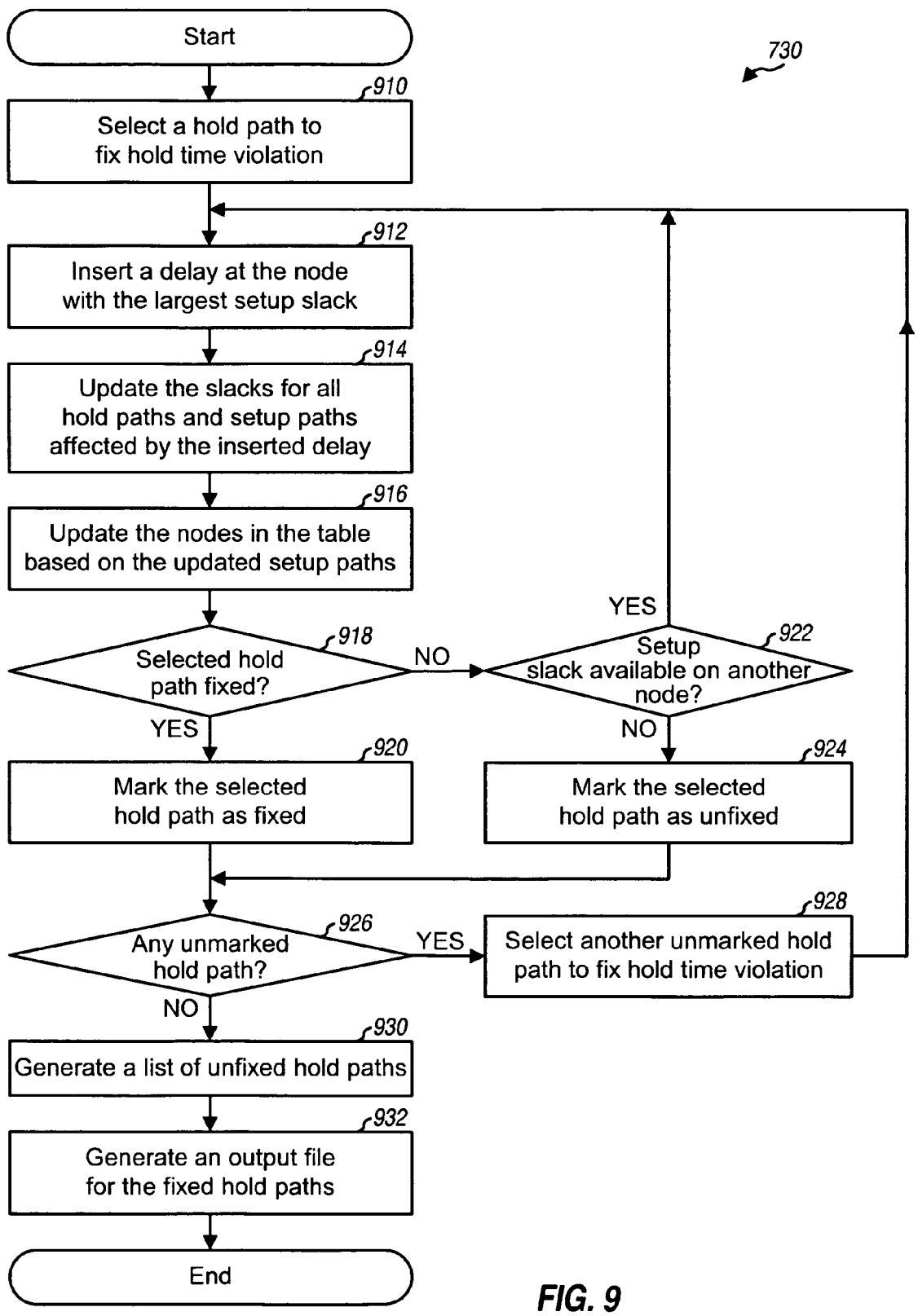
FIG. 9 shows a process for inserting delays to fix hold time violations.

FIG. 9 shows an embodiment of block 730 for inserting delays to fix hold time violations. A hold path is selected for fixing hold time violation (block 910). The node with the largest setup slack is identified for the selected hold path, and a delay is inserted at the selected node (block 912). The amount of delay inserted at this node is either (1) enough to fix the hold time violation for the selected hold path or (2) the largest amount possible without violating the setup time for the related setup paths containing this node. The slacks for all hold paths and all setup paths affected by the inserted delay are updated (block 914). To update the setup paths, all setup paths containing the selected node are identified, and the slacks for these setup paths are updated (or decreased) by the amount of delay inserted at the node times the delay ratio. This update ensures that these setup paths are not over-used to fix hold time violations for other hold paths. To update the hold paths, all hold paths containing the selected node are identified, and the slacks for these hold paths are updated (or increased) by the amount of delay inserted at the node. This update ensures that these hold paths are not over-fixed. The nodes in the table are then updated based on the updated setup paths (block 916). For each setup path that was updated in block 914, all nodes of that setup path are identified in the table, and the slacks for these nodes are updated with the slack for this setup path if this slack is smaller than the values currently stored for these nodes.

A determination is then made whether the hold time violation for the selected hold path has been fixed (block 918). If the answer is 'Yes', then the selected hold path is marked as fixed (block 920). Otherwise, if the answer is 'No' for block 918, then a determination is made whether a setup slack greater than a predetermined threshold (e.g., 0.1 nsec for the examples above) is available in another node of the selected hold path (block 922). If the answer is 'Yes', then the process returns to block 912 to insert another delay at the node with the largest setup slack. Otherwise, if the answer is 'No' for block 922, then the selected hold path is marked as unfixed (block 924).

After blocks 920 and 924, a determination is made whether there are any unmarked hold paths, i.e., hold paths that have not been selected for fixing hold time violations (block 926). If the answer is 'Yes', then another unmarked hold path is selected for fixing hold time violation (block 928). The process then returns to block 912 to attempt fixing the hold time violation for this newly selected hold path. If all hold paths have already been selected and the answer is 'No' for block 926, then a list of unfixed hold paths is generated (block 930) and an output file is generated for the fixed hold paths (block 932).

Figure 10:
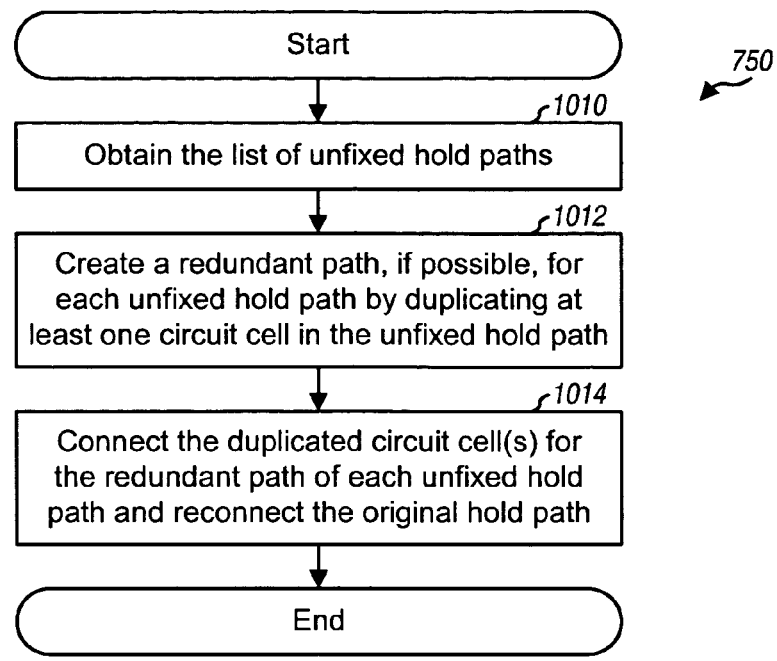
FIG. 10 shows a process for inserting redundant paths.

FIG. 10 shows an embodiment of block 750 for inserting redundant paths for hold paths with unfixed hold time violations. The list of unfixed hold paths is obtained (block 1010). Each unfixed hold path corresponds to a list of circuit cells from the circuit design. A redundant path is created, if possible, for each unfixed hold path by duplicating at least one circuit cell in the unfixed hold path (block 1012). In an embodiment, a redundant path is created by tracing backward from the end point of the unfixed hold path and duplicating the first combinatorial cell with a fan-out of more than one and concluding at the last combinatorial cell in the unfixed hold path with a fan-in of at least two. For the example shown in FIG. 4, AND gates U1 and U4 would be duplicated for the first timing path by this embodiment. A redundant path may also be created in other manners. For example, a redundant path may be created by replicating only the circuit cell containing the node with the smallest setup slack, the circuit cell containing the node included in multiple unfixed hold paths, and so on. In any case, the duplicated circuit cell(s) for the redundant path for each unfixed hold path are connected, and the original hold path is reconnected, e.g., as shown in FIG. 5 (block 1014). The new hold paths with the redundant paths are provided to block 730 in FIG. 7 for fixing hold time violations. For each new hold path, the hold time violation may often be fixed by inserting a delay at the first node in the redundant path closest to the starting node (e.g., the B input of duplicated AND gate U5 in FIG. 5).

Figure 11:
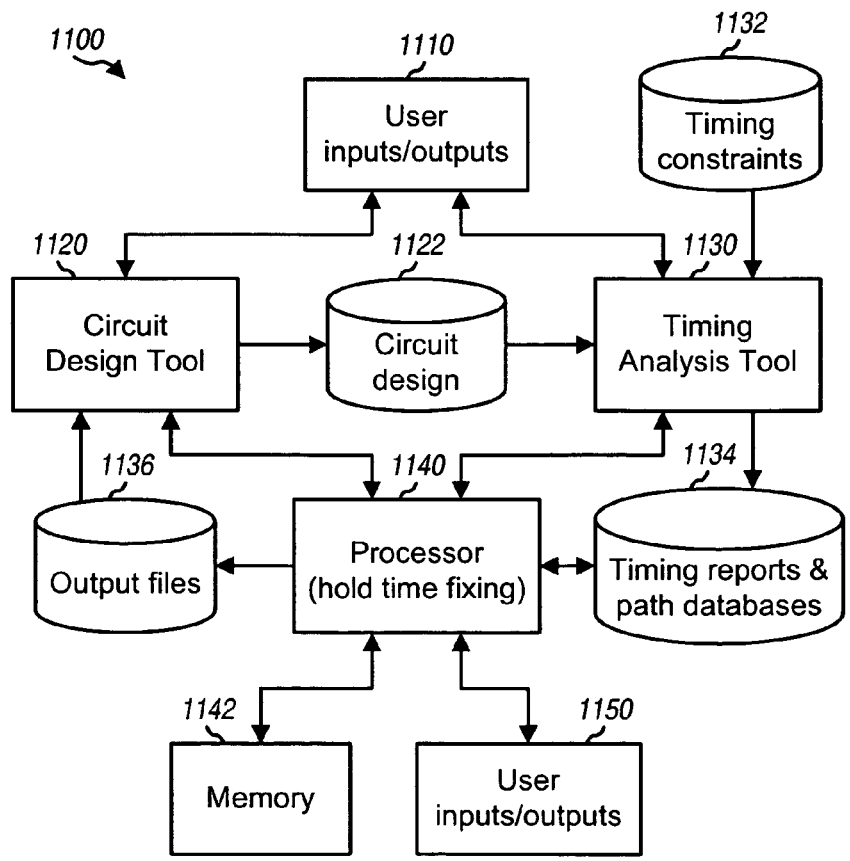
FIG. 11 shows a setup for generating and analyzing a circuit design and for fixing hold time violations.

FIG. 11 shows a block diagram of a setup 1100 for generating and analyzing a circuit design and for fixing hold time violations. A circuit design tool 1120 such as Verilog, HDL (hardware description language), VHDL (very high-speed IC hardware description language), or some other electronic design automation (EDA) tool is used to generate a circuit design. The circuit design is created with user inputs 1110 and stored in a storage unit 1122. A timing analysis tool 1130 performs timing analysis on the circuit design with the timing constraints from a storage unit 1132 and provides timing reports to a storage unit 1134. A processor 1140 creates the databases for the hold paths and related setup paths based on the timing reports and the circuit model for the circuit design and stores the databases in storage unit 1134. Processor 1140 also fixes hold time violations and generates output files, which are stored in a storage unit 1136. The hold time violations may be fixed based on user inputs 1150. A memory unit 1142 stores program codes (e.g., for the processes shown in FIGS. 6 through 10) and other data used by processor 1140. Processor 1140 may perform the processes shown in FIGS. 6 through 10.

The hold time fixing techniques may be used in any stage of a circuit design flow whenever hold time violations need to be fixed, e.g., prior to or after Clock Tree Synthesis (CTS), prior to or after routing, and so on. CTS builds a buffer tree for each clock, if needed, to satisfy the maximum transition time and maximum load constraints and to balance the arrival time at a clock pin connected to that clock. IC designers often attempt to meet timing requirements before and after CTS. The techniques described herein may be used regardless of whether a clock tree exists for each clock.

The circuit design tool may be used to fix hold time violations prior to applying the hold time fixing techniques. This may be advantageous because the different operating modes. This timing path may be identified for redesign, or redundant path insertion may be used to remedy the two violations.

The techniques described herein may be used for circuit designs for various end applications such as wireless communication, networking, computing, and so on. For example, these techniques may be used for circuit designs intended to operate in one or multiple operating modes for wireless communication systems such as a Code Division Multiple Access (CDMA) system, a Global System for Mobile Communications (GSM), and so on. A CDMA system may implement IS-95, IS-2000, and IS-856 standards from a consortium named "3rd Generation Partnership Project 2" (3GPP2) and/or Wideband CDMA (W-CDMA) standard from a consortium named "3rd Generation Partnership Project" (3GPP). The same circuit design may be required to operate at different clock rates for different communication systems, which then results in different timing constraints for the circuit design.

The hold time fixing techniques described herein may be implemented by various means. For example, these techniques may be implemented in hardware, software, or a combination thereof. For a hardware implementation, the processing units used to fix hold time violations may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

For a software implementation, the hold time fixing techniques may be implemented with modules (e.g., procedures, functions, and so on) that perform the functions described herein. The software codes may be stored in a processor readable media (e.g., a CD ROM) or a memory unit (e.g., memory unit 1142 in FIG. 11) and executed by a processor (e.g., processor 1140). The memory unit may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not insertion of delay buffers to fix hold time violations may affect timing. The circuit design tool can more accurately determine the timing of the circuit design. The hold time fixing techniques estimate delay based on typical input slew and output load and ignores load change due to buffer insertion for circuit cells before and after the inserted delay buffer. Nevertheless, the techniques can achieve good results by applying timing margin to ensure both setup time and hold time are not violated. Timing margin may be explicitly specified and used to fix hold time violations. A bigger-than-needed delay ratio also leaves some margin. The techniques may also be applied to an entire circuit design or a portion of the circuit design. For example, the techniques may or may not be used in a highly congested and highly utilized area of the circuit design.

The hold time fixing techniques can fix hold time violations by inserting delays at the appropriate locations in the timing paths. Unlike some conventional tools that only insert delays at either the starting point or the end point of timing paths, the techniques can also insert delays at internal nodes. The techniques can also insert circuit cells as needed in order to fix hold time violations that cannot be fixed otherwise.

The hold time fixing techniques may be used to fix hold time violations for a circuit design with one or multiple operating modes. Different operating modes may have different timing constraints, which may impose different timing requirements for the same timing paths. For setup time, the circuit design may be constrained with the tightest setup time requirements for all operating modes, which then ensures that the setup time requirements for all operating modes will be met. For hold time, the hold time violations in the circuit design are fixed with awareness of the setup times for all operating modes. Fixing hold time violations for multiple operating modes is challenging for a conventional tool that cannot combine timing information for these multiple operating modes. This is because fixing hold time violations for one operating mode without being aware of the timing for the other operating modes may cause setup time violations in the other operating modes. The conventional tool can only handle one set of timing constraints at a time and may require multiple time-consuming iterations to fix both hold and setup time violations in different operating modes.

The techniques described herein can also detect a scenario whereby a timing path violates (or is critical on) both setup time and hold time, at least one of the two violations cannot be fixed without affect the other, and the two violations are in intended to be limited to the embodiments shown herein but is to be accorded the widest scope consistent with the principles and novel features disclosed herein.

What is claimed is:

1. A method of fixing hold time violations in a circuit design, comprising:
   obtaining timing information for the circuit design;
   identifying signal paths in the circuit design with hold time violations based on the timing information;
   inserting redundant paths for selected ones of the signal paths with hold time violations; and
   inserting delays in remaining ones of the signal paths with hold time violations at locations determined by the timing information.

2. The method of claim 1, wherein the obtaining the timing information for the circuit design comprises
   obtaining hold time information and setup time information for a plurality of signal paths in the circuit design.

3. The method of claim 1, wherein the obtaining the timing information for the circuit design comprises
   obtaining timing information for the circuit design for a plurality of operating modes, each operating mode being associated with a respective set of timing constraints for the circuit design.

4. The method of claim 1, further comprising:
   generating at least one database based on a circuit model for the circuit design and the timing information for the circuit design; and
   using the at least one database to insert redundant paths for selected ones of the signal paths with hold time violations and to insert delays in remaining ones of the signal paths with hold time violations.

5. The method of claim 1, wherein the inserting delays in the remaining ones of the signal paths with hold time violations comprises
   inserting delays in the remaining ones of the signal paths with hold time violations at locations determined by the timing information and further to avoid violating setup time requirements for the circuit design.

6. The method of claim 1, wherein the inserting delays in the remaining ones of the signal paths with hold time violations comprises
   for each remaining signal path with hold time violation,
      identifying at least one node in the signal path for insertion of delay, and
      inserting a delay at each of the at least one node identified for the signal path.

7. The method of claim 6, wherein the inserting delays in the remaining ones of the signal paths with hold time violations further comprises
   for each remaining signal path with hold time violation,
      determining a maximum amount of delay permitted at each of the at least one node identified for the signal path, and wherein the delay inserted at each of the at least one node is limited by the maximum amount of delay permitted at the node.

8. The method of claim 7, wherein the maximum amount of delay permitted at each node is determined based on setup time requirements for the circuit design.

9. The method of claim 1, wherein the inserting delays in the remaining ones of the signal paths with hold time violations comprises
   identifying nodes appearing in multiple remaining signal paths with hold time violations, and
   inserting delays at the identified nodes.

10. The method of claim 1, further comprising:
    updating timing of signal paths affected by the insertion of the delays.

11. The method of claim 1, wherein the inserting the redundant paths for selected ones of the signal paths with hold time violations comprises
    for each selected signal path with hold time violations,
       identifying at least one circuit cell in the selected signal path based on characteristics of the at least one circuit cell, and replicating the at least one circuit cell to form a redundant path for the selected signal path.

12. The method of claim 11, wherein the at least one circuit cell is identified based on fan in and fan out characteristics.

13. The method of claim 1 further comprising:
inserting delays in the redundant paths to fix hold time violations for the signal paths containing the redundant paths.

14. A method of fixing hold time violations in a circuit design, comprising:
obtaining a hold slack for each of a first plurality of signal paths in the circuit design with hold time violations;
obtaining a setup slack for each of a second plurality of signal paths in the circuit design, each signal path in the second plurality of signal paths having at least one node in common with at least one signal path in the first plurality of signal paths; and
inserting delays in the first plurality of signal paths at locations determined by hold slacks for the first plurality of signal paths and setup slacks for the second plurality of signal paths.

15. The method of claim 14, further comprising:
determining setup slacks for nodes of each signal path in the first plurality of signal paths based on the setup slacks for the second plurality of signal paths.

16. The method of claim 14, wherein the obtaining the hold slack for each of the first plurality of signal paths comprises, for each of the first plurality of signal paths, obtaining a hold slack for the signal path for each of a plurality of operating modes for the circuit design, and
wherein the obtaining the setup slack for each of the second plurality of signal paths comprises, for each of the second plurality of signal paths, obtaining a setup slack for the signal path for each of the plurality of operating modes.

17. The method of claim 15, further comprising:
generating at least one database based on a circuit model for the circuit design, the hold slacks for the first plurality of signal paths, and the setup slacks for the second plurality of signal paths; and
using the at least one database to insert the delays in the first plurality of signal paths.

18. The method of claim 14, wherein the inserting delays in the first plurality of signal paths comprises
inserting a delay at a node associated with a largest setup slack among all nodes in each signal path in the first plurality of signal paths.

19. The method of claim 14, further comprising:
updating setup slacks and hold slacks of signal paths affected by the insertion of the delays for the first plurality of signal paths.

20. An apparatus comprising:
a storage unit operative to store timing information for a circuit design, the timing information comprising a hold slack for each of a first plurality of signal paths in the circuit design and a setup slack for each of a second plurality of signal paths in the circuit design, each signal path in the second plurality of signal paths having at least one node in common with at least one signal path in the first plurality of signal paths; and
a processor operative to identify signal paths in the circuit design with hold time violations based on the timing information and to insert delays in the signal paths with hold time violations at locations determined by the timing information.

21. The apparatus of claim 20, wherein the processor is further operative to determine setup slacks for nodes of each signal path in the first plurality of signal paths based on the setup slacks for the second plurality of signal paths.

22. The apparatus of claim 20, wherein the processor is further operative to generate at least one database based on a circuit model for the circuit design, hold slacks for the first plurality of signal paths, and setup slacks for the second plurality of signal paths, and to use the at least one database to insert the delays for the signal paths with hold time violations.

23. The apparatus of claim 22, wherein the circuit model comprises a plurality of nodes and a plurality of connections between the plurality of nodes, and wherein the first and second pluralities of signal paths are formed by the plurality of nodes and the plurality of connections.

24. The apparatus of claim 23, wherein the first and second pluralities of signal paths are for nodes corresponding to inputs and outputs of the circuit design and inputs and outputs of sequential circuits in the circuit design.

25. The apparatus of 20, wherein the processor is operative to insert delays in the signal paths with hold time violations based on hold slacks for the first plurality of signal paths and setup slacks for the second plurality of signal paths.

26. The apparatus of claim 20, wherein the processor is operative to update setup slacks and hold slacks of signal paths affected by the insertion of the delays in the signal paths with hold time violations.

27. The apparatus of claim 20, wherein the timing information is for a plurality of operating modes for the circuit design, each operating mode being associated with a respective set of timing constraints for the circuit design.

28. The apparatus of claim 27, wherein the plurality of operating modes are for functional and test modes for the circuit design.

29. The apparatus of claim 27, wherein the plurality of operating modes are for a plurality of communication system standards supported by the circuit design.

30. An apparatus comprising:
a storage unit operative to store timing information for a circuit design; and
a processor operative to identify signal paths in the circuit design with hold time violations based on the timing information, to insert redundant paths for selected ones of the signal paths with hold time violations, to insert delays in the redundant paths to fix hold time violations for the signal paths containing the redundant paths, and to insert delays in remaining ones of the signal paths with hold time violations at locations determined by the timing information.

31. An apparatus comprising:
means for obtaining timing information for a circuit design, the timing information comprising a hold slack for each of a first plurality of signal paths in the circuit design and a setup slack for each of a second plurality of signal paths in the circuit design, each signal path in the second plurality of signal paths having at least one node in common with at least one signal path in the first plurality of signal paths;
means for identifying signal paths in the circuit design with hold time violations based on the timing information; and
means for inserting delays in the signal paths with hold time violations at locations determined by the timing information.

32. The apparatus of claim 31, further comprising:
means for generating at least one database based on a circuit model for the circuit design, hold slacks for the first plurality of signal paths, and setup slacks for the second plurality of signal paths; and
means for using the at least one database to insert the delays for the signal paths with hold time violations.

33. The apparatus of claim 31, wherein the means for inserting delays in the signal paths with hold time violations comprises
means for inserting delays in the signal paths with hold time violations based on hold slacks for the first plurality of signal paths and setup slacks for the second plurality of signal paths.

34. The apparatus of claim 31, further comprising:
means for updating setup slacks and hold slacks of signal paths affected by the insertion of the delays in the signal paths with hold time violations.

35. An apparatus comprising:
means for obtaining timing information for a circuit design;
means for identifying signal paths in the circuit design with hold time violations based on the timing information;
means for inserting redundant paths for selected ones of the signal paths with hold time violations;
means for inserting delays in the redundant paths to fix hold time violations for the signal paths containing the redundant paths; and
means for inserting delays in remaining ones of the signal paths with hold time violations at locations determined by the timing information.

36. A processor readable media for storing instructions to:
obtain timing information for a circuit design, the timing information comprising a hold slack for each of a first plurality of signal paths in the circuit design and a setup slack for each of a second plurality of signal paths in the circuit design, each signal path in the second plurality of signal paths having at least one node in common with at least one signal path in the first plurality of signal paths;
identify signal paths in the circuit design with hold time violations based on the timing information; and
insert delays in the signal paths with hold time violations at locations determined by the timing information.

37. The processor readable media of claim 36, and further for storing instructions to:
generate at least one database based on a circuit model for the circuit design and the timing information for the circuit design; and
use the at least one database to insert the delays in the signal paths with hold time violations.

38. A processor readable media for storing instructions to:
obtain timing information for a circuit design;
identify signal paths in the circuit design with hold time violations based on the timing information;
insert redundant paths for selected ones of the signal paths with hold time violations;
insert delays in the redundant paths to fix hold time violations for the signal paths containing the redundant paths; and
insert delays in remaining ones of the signal paths with hold time violations at locations determined by the timing information.

* * * * *